(12) United States Patent
Matsuo et al.

(10) Patent No.: US 7,404,162 B2
(45) Date of Patent: Jul. 22, 2008

(54) BUFFERING TECHNIQUE USING STRUCTURED DELAY SKEWING

(75) Inventors: Shinichiro Matsuo, Yokohama (JP); Toshinori Otaka, Chiba (JP)

(73) Assignee: Micron Technology, Inc., Boise, ID (US)

( * ) Notice: Subject to any disclaimer, the term of this patent is extended or adjusted under 35 U.S.C. 154(b) by 245 days.

(21) Appl. No.: 11/211,501

(22) Filed: Aug. 26, 2005

(65) Prior Publication Data

US 2007/0044054 A1    Feb. 22, 2007

(30) Foreign Application Priority Data

Aug. 22, 2005 (JP) ............................. 2005-240328

(51) Int. Cl.
*G06F 17/50* (2006.01)

(52) U.S. Cl. .................................. 716/6; 716/2; 716/12
(58) Field of Classification Search ...................... 716/1, 716/2, 6, 12, 18
See application file for complete search history.

(56) References Cited

U.S. PATENT DOCUMENTS 7,073,145 B2 *   7/2006   Fry et al. ........................ 716/6

* cited by examiner

*Primary Examiner*—Thuan Do
(74) *Attorney, Agent, or Firm*—Dickstein Shapiro LLP

(57) ABSTRACT

A line buffering technique in which a plurality of line buffers are arranged based on a determined average number of branches and stages that are necessary to implement the buffers based on design constraints. In an exemplary embodiment, the line buffers may be arranged in any buffer topology arrangement meeting the average number of branches and the number of stages design constraints.

21 Claims, 6 Drawing Sheets

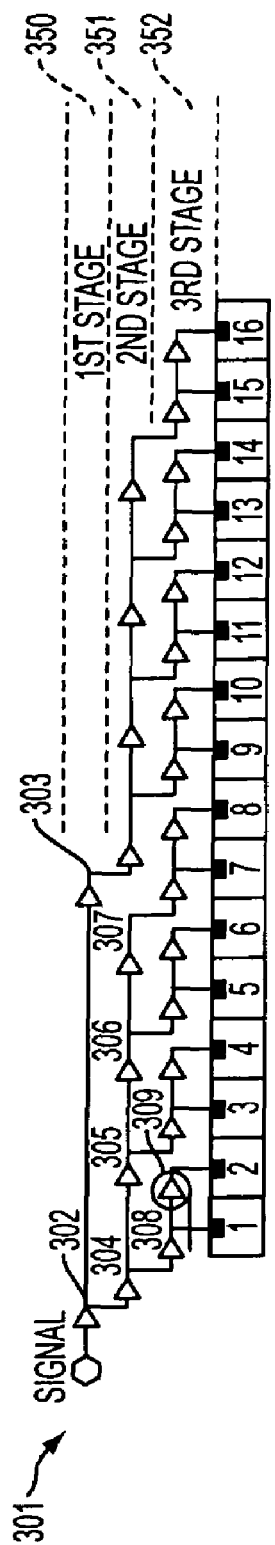
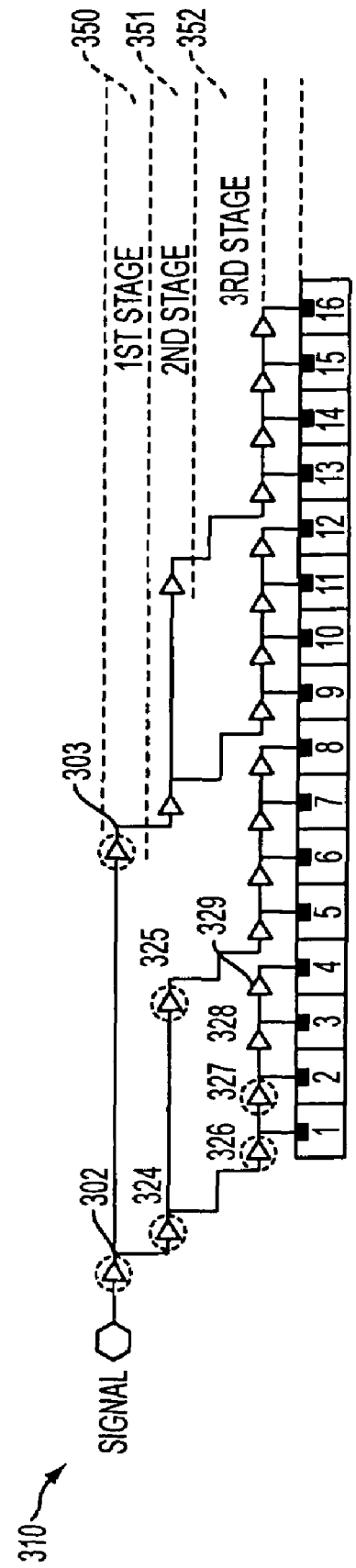
FIG. 2B
FIG. 2C

US 7,404,162 B2

BUFFERING TECHNIQUE USING STRUCTURED DELAY SKEWING

FIELD OF THE INVENTION

This application claims priority to Japanese Patent Application No. 2005-240328, filed Aug. 22, 2005.

The invention relates to a buffering technique and more particularly to a structured skewing buffering method.

BACKGROUND OF THE INVENTION

Imaging devices, including charge coupled devices (CCD) and complementary metal oxide semiconductor (CMOS) imagers, are commonly used in photo-imaging applications.

A CMOS imager circuit includes a focal plane array of pixels, each one of the cells including a photosensor, for example, a photogate, photoconductor or a photodiode overlying a substrate for accumulating photo-generated charge in the underlying portion of the substrate. Each pixel has a readout circuit that includes at least an output field effect transistor formed in the substrate and a charge storage region formed on the substrate connected to the gate of an output transistor. The charge storage region may be constructed as a floating diffusion region. Each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel perform the necessary functions of: (1) photon to charge conversion; (2) accumulation of image charge; (3) resetting the storage region to a known state; (4) transfer of charge to the storage region accompanied by charge amplification; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. Nos. 6,140,630, 6,376,868, 6,310,366, 6,326,652, 6,204,524 and 6,333,205, assigned to Micron Technology, Inc., which are hereby incorporated by reference in their entirety.

Relatively long signal lines are used in an imager integrated circuit to implement and interconnect the components used to process image data. A tree type routing scheme is widely accepted in many long signal line applications, including imager applications, where timing convergence, automatic placement and routability are required. Typically, automatic design tools use the tree type routing scheme to achieve the best possible maximum operating frequency. These design tools insert many line buffers into the design to meet the timing constraints and maintain signal integrity. However, the tree type routing scheme does not work well when implemented in large/small aspect ratio (i.e., width/height ratio of an array, for example an imager array or a memory block) designs. Often, too many line buffers are inserted into the design, which results in the timing constraints not being met, which in turn results in poor performance.

Typically when a long line is routed, the tree type routing scheme inserts a repeat line buffer corresponding to a first buffer branch 121, located in a first stage 217, that is at the center of the target signal sink points (e.g., device inputs 1-16), as illustrated in FIG. 1. FIG. 1 also illustrates three more buffer stages 218, 219, 220 and many more branches 122, 123, 124. In a branch subsequent to the first branch 121, repeat line buffers are placed at the halfway point of the span between the left or right terminal and the repeat line buffer of the first branch 121 (or other previously placed buffers). This process continues until the repeat line buffers are close enough to the sink points (circuit inputs) 1-16 and the loading capacitance is small enough to be driven.

The tree type routing scheme is an effective scheme when deriving the maximum operational frequency of the whole circuit having an aspect ratio of approximately 1:1. In this implementation, the operating frequency as a whole is not hindered by several extremely slow paths. However, this routing scheme is not effective when the aspect ratio is large/small.

In the tree type routing scheme the sink points are driven by the last stage line buffers (e.g., line buffers 125, 126, 127, 128, 129, 130, 131, 132). The tree type routing scheme is arranged such that all of the sink points 1-16 (circuit inputs) are driven and switched at approximately the same time, which results in a high current peak at the switching point. This is often undesirable. Further, in the tree type routing scheme many horizontal signal lines are required because the direction of the signals is bidirectional in the horizontal direction of the routing scheme illustrated in FIG. 1. This characteristic may degrade the routing metal and thus create a higher risk of area congestion.

Accordingly, there is a need and desire for a buffering technique that reduces the number of line buffers and provides a propagation delay which reduces the peak current.

BRIEF SUMMARY OF THE INVENTION

In the exemplary embodiment of the invention a plurality of line buffers are arranged based on a determined average number of branches and stages that are necessary to implement the buffers based on design constraints. In an exemplary embodiment of the invention, the line buffers may be arranged in any buffer topology arrangement meeting the average number of branches and the number of stages design constraints.

The invention may be advantageously employed in an analog-to-digital conversion stage of an imager.

BRIEF DESCRIPTION OF THE DRAWINGS

The foregoing and other advantages and features of the invention will become more apparent from the detailed description of exemplary embodiments provided below with reference to the accompanying drawings in which:

FIGS. 2A-C illustrate exemplary routing techniques according to exemplary embodiments of the present invention;

DETAILED DESCRIPTION OF THE INVENTION

Figure 1:
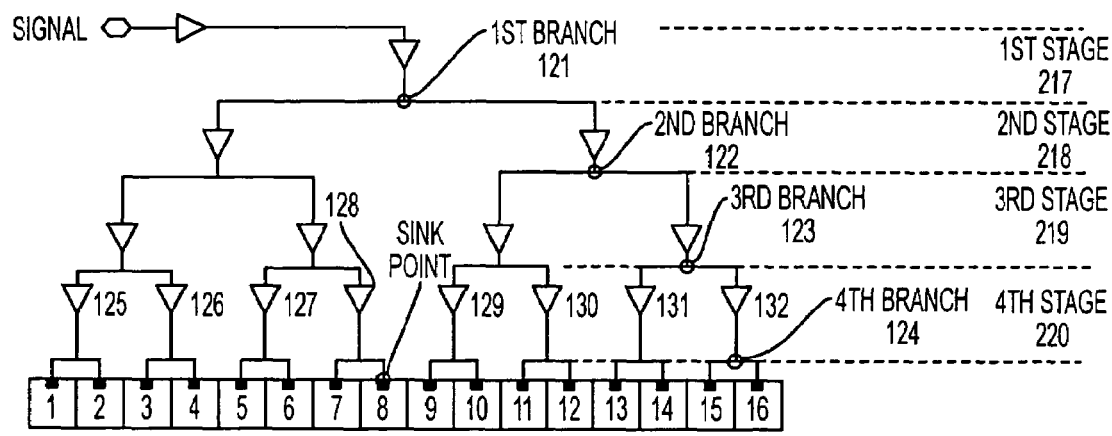
FIG. 1 illustrates a tree type routing scheme.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The invention relates to a buffering technique, implemented on standard operative circuit cells (e.g., RAM memory blocks), which reduces the number of stages of buffers needed to connect to a sink point (i.e., a cell input) of the standard cell and which reduces peak power consumption. In implementing the invention, the number of buffer stages and the number of buffer branches are calculated based on the application's design constraints, such as maximum number of allowed buffer stages. A designer or computer program, for example, may provide the maximum possible number of stages (S) that may be implemented in the topology. The topology of the invention may be implemented with fewer that the maximum possible number of stages. Accordingly, once the maximum possible number of stages (S) is predetermined, the required average number of branches may be calculated e.g., using equation (1):

$$\text{Ave. Number of Branches}=10^{((\log N)/S)}, \quad (1)$$

where N is the number of sink points and S is the maximum possible number of stages. The number of stages needed for the topology may be calculated e.g., using equation (2):

$$\text{Required Number of Stages}=\text{ceil}(\log_x(N)), \quad (2)$$

where x is the average number of branches calculated in equation (1), N is the number of sink points and "ceil" indicates that the result should be rounded up. The above equations (1), (2) are only exemplary and the average number of branches and the required number of stages may be calculated using other methods.

Once the number of stages and the average number of branches are determined, a desired topology implementation can be created either by a designer or by a computer program, for example. For example, if the Required Number of Stages is three and the Average Number of Braches is 2.67 and it is determined that a topology having three stages is desired, the implementer (e.g., designer, program) could implement either of the topologies illustrated in FIGS. 2B-C. FIG. 2B illustrates a three stage topology 301 which has two first stage branches 302, 303 and four buffers, e.g., buffers 304-307, in the second stage 351, connected to each of the respective first stage branches 302, 303. Further, each of the second stage buffers 304-307 has two buffers serially connected, e.g., buffers 308, 309 serially connected to buffer 304. The topology of FIG. 2C similarly has two first stage branches 302, 303, however, each branch 302, 303 of the first stage 350 only has two buffers 324, 325 of the second stage 351 serially connected. Each of the buffers, e.g., buffers 324, 325, of the second stage 351 is serially connected to four buffers, e.g., buffers 326-329, of the third stage 352. Both of these implementations meet the Required Number of Stages and Average Number of Branches design constraints. Unlike the tree type scheme, the topologies of the present invention form a fish bone structure. One particular advantage of the embodiments described herein is that a flexible topology may be tailored to the desired implementation. Any topology that meets the average number of branches may be used. The flexibility of the topology enables the implementer to balance the vertical routing area and the distribution of the propagation delay as necessary for the implementation. The propagation delay from the signal source to the sink points are varied for the different sink points. Generally, the propagation delay of the proposed scheme is symmetrically varied, whereas the tree type scheme has a strong peak current value since the propagation delay is balanced to fall within the certain range.

Figure 2A:
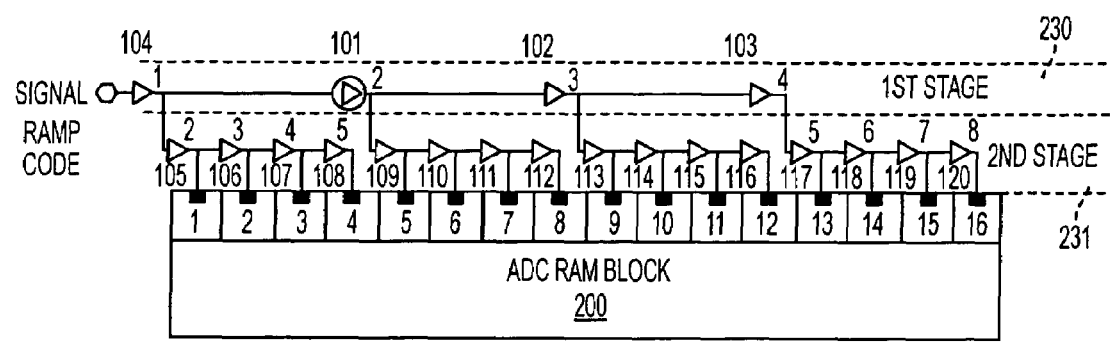

FIG. 2A illustrates an exemplary topology implementation according to an embodiment of the invention which is used on a ramp code input to RAM memory as part of an analog-to-digital conversion circuit. FIG. 2A illustrates two stages 230, 231 each having at least one line buffer. Stage one 230 is comprised of serially connected bridge line buffers 101, 102, 103 and line buffer 104. Stage two 231 is comprised of a plurality of line buffers 105-120 which are connected to sink points 1-16. The stage two line buffers 105-120 are arranged as sets of buffers, e.g., buffers 105, 106, 107, 108 from one set, which are serially connected with the input of the serial connection being connected to an output of a respective one of the first stage line buffers, e.g., buffer 104 for serially connected buffer set 105, 106, 107, 108. It should be noted that the distribution of the propagation delay provided by the serially connected line buffers 105-120 and serially connected bridge buffers 101, 102, 103, is acceptable as long as it meets the setup and hold timing defined by the sink points. The advantages of the topology are best utilized when the distribution of the propagation delay occurs within one period of the clock driving the signal to the sink points.

Since the signal is input into each sink point at a slightly different time during the clock period, the number of sink points simultaneously switching is reduced. Accordingly, the peak current is lowered and noise generated by the digital switching, that may affect the analog signal chain, decreases. In an imager implementation, this reduction in noise increases image quality.

The invention enables multiple topology implementations for a given set of design constraints. For example, if the clock frequency is high and there is a minimal room timing margin, a topology having more stages can be adopted. The bridge line buffers 101, 102, 103 of the topology limit the signal flow to one direction. In FIG. 2A, the signal, e.g., ramp code which is input to RAM Block 200, must flow from left to right, unlike the tree scheme (FIG. 1). The derived topology also enables efficient layout of the line buffers because the local line buffer chains of the last stage drive the neighboring sink points which, in the FIG. 2A example, are input to ADC RAM block 200, e.g., 105-108 drive sink points 1-4 illustrated in FIG. 2A, and thus they can be placed near the sink points. The links that connect the local line buffers (e.g., 105, 106, 107, 108) to the upper stages (e.g., 230) are the bridge line buffers 104, 101, 102, 103, and do not require the use of a long wire.

As previously noted, the invention may be implemented in an image sensor. In particular, each column of pixel data in a pixel array (see FIG. 4) is processed by an analog-to-digital converter 466 (see FIG. 4), where the number of analog-to-digital converters may be equal to the number of columns in the pixel array 405.

Figure 3:
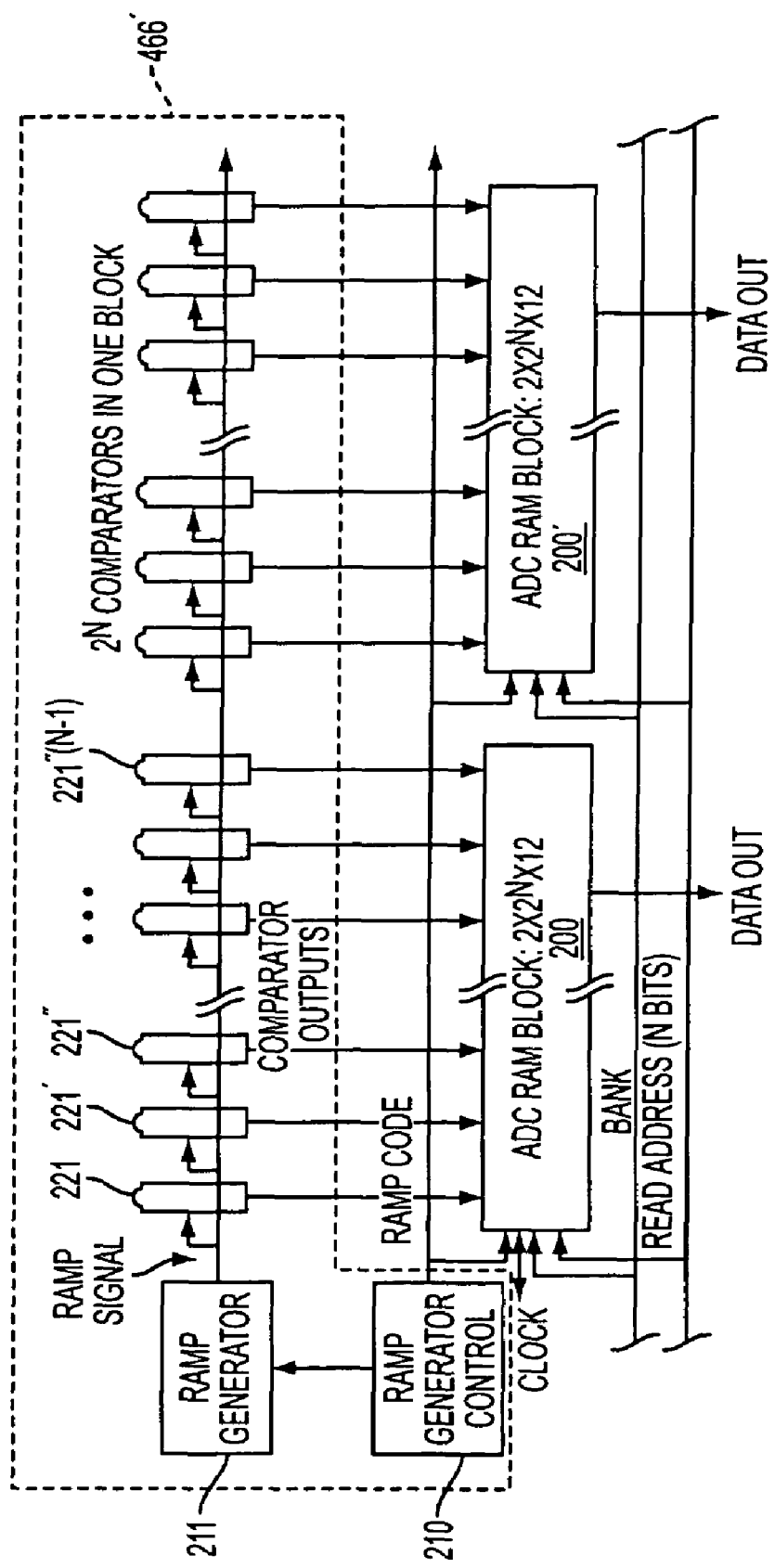
FIG. 3 is a block diagram illustrating a portion of a column signal processing circuit of an imager.

FIG. 3 illustrates a more specific implementation of the FIG. 2A ADC RAM Block 200 and includes a ramp generator 211, a ramp generator control 210, a plurality of comparators 221, 221', etc. of the analog-to-digital converters 446' and a plurality of ADC RAM memory blocks 200, 200'. (Block 466' illustrates a plurality of analog-to-digital converters each having at least one comparator 221, 221', etc., and sharing the ramp generator 211, and the ramp generator controller 210, for example). The circuit illustrated in FIG. 3 is driven by a clock signal. In this exemplary embodiment, a ramp analog-to-digital converter design is used in which a global ramp signal, generated by the ramp generator 211, is compared with the pixel signal level in comparators 221, 221', etc. As the ramp signal is increased, a digital code, e.g., 12 bit ramp code, is also generated to indicate the corresponding digital value of the ramp signal. When the ramp signal increases to the point where it exceeds the analog level of a pixel signal being converted, a comparator e.g., 221, flips logic states. At that point the ramp code representing the data value is stored in a memory location within the ADC RAM memory blocks 200, 200' to be read back later. It should be noted that more than one memory 200, 200' location can be written in a single clock cycle when more than one comparator flips 221, 221', etc. In the FIG. 3 embodiment, the topology of the invention is implemented on the ramp code signal which is input in the ADC RAM blocks 200, 200' which receives the 12 bit ramp code for each sink point 1-16. The sink points 1-16, illustrated in FIG. 2A, are inputs into the ADC RAM Block 200. The ADC RAM blocks 200, 200' provide memory to store the digital code values corresponding to the ramp level when a comparator 221, 221', etc. flips states. In an imager implementation, the topology may also be implemented, for example, on any control signals necessary for the ADC RAM Blocks 200, 200'.

The proposed buffering technique is not limited to use with ramp code signal described herein. For example, the buffering technique may also be applied to an analog-to-digital converter clock signal. Typically, the clock line is automatically synthesized by clock tree syntheses to realize a low skew between clock pins (i.e., sink points). However, in an imager implementation, a skew between clock pins is inconsequential. The skew on the clock line will result in shading in a captured image, however, shading is usually removed by a column offset calibration and by a correction module. This module exists in the digital data path for the column parallel architecture CMOS imager to remove the offsets of the column amplifiers otherwise vertical fixed pattern noise becomes visible. Thus without any additional costs, the clock line for an analog-to-digital memory may be implemented using the above described embodiments.

Figure 4:
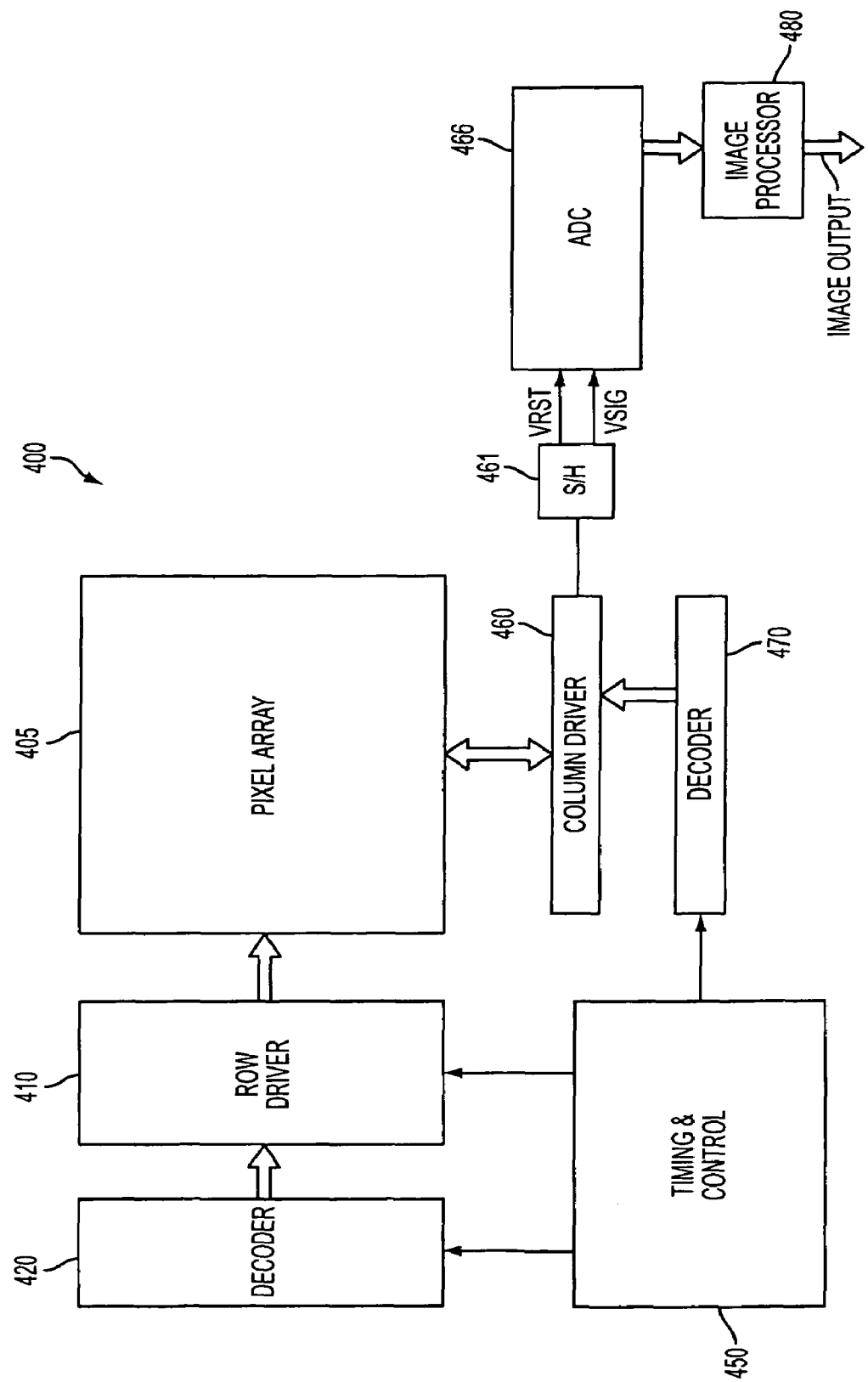
FIG. 4 is a block diagram of a CMOS imager, which may be utilized in accordance with an embodiment of the invention.

FIG. 4 illustrates an exemplary imager 400 that may be used in an imaging system and implement exemplary embodiments illustrated in FIGS. 2-3. The imager 400 has a pixel array 405. Row lines are selectively activated by a row driver 410 in response to row address decoder 420. A column driver 460 and column address decoder 470 are also included in the imager 400. The imager 400 is operated by the timing and control circuit 450, which controls the address decoders 420, 470. The control circuit 450 also controls the row and column driver circuitry 410, 460.

A sample and hold circuit 461 associated with the column driver 460 reads a pixel reset signal Vrst and a pixel image signal Vsig for selected pixels. An analog-to-digital converter 466 (ADC) outputs a digital code corresponding to the difference between the Vrst and Vsig signals. The analog-to-digital converter 466 supplies the digitized pixel signals to an image processor 480, which forms and outputs a digital image.

Figure 5:
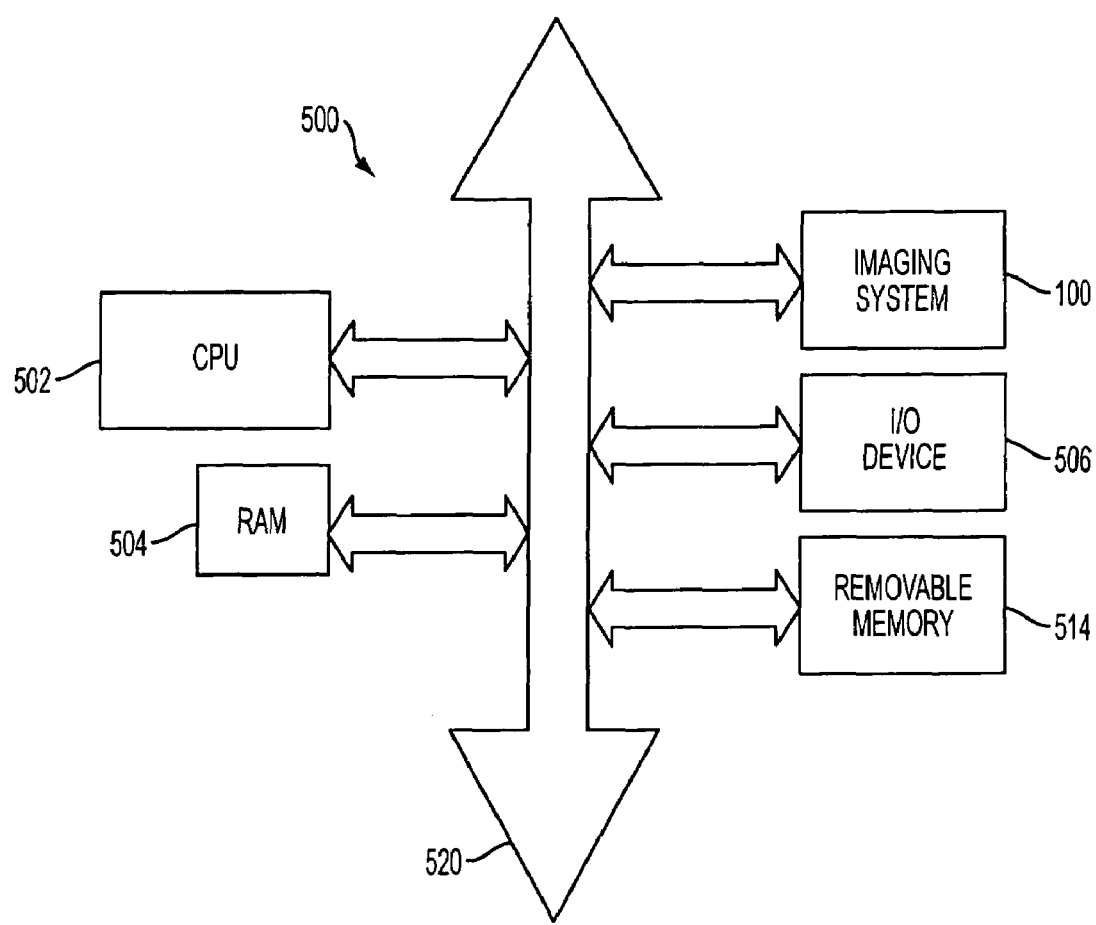
FIG. 5 illustrates a processor system incorporating at least one imaging device constructed in accordance with an embodiment of the invention.

FIG. 5 shows a system 500, a typical processor system modified to include an imaging system 100 of an exemplary embodiment the invention. The processor system 500 is exemplary of a system having digital circuits that could include imager devices and implementing the buffering technique of the invention. Without being limiting, such a system could include a computer system, camera system, scanner, machine vision, vehicle navigation, video phone, surveillance system, auto focus system, star tracker system, motion detection system, image stabilization system, and other imaging system.

System 500, for example a camera system, generally comprises a central processing unit (CPU) 502, such as a microprocessor, that communicates with an input/output (I/O) device 506 over a bus 520. Imaging system 100 also communicates with the CPU 502 over the bus 520. The processor-based system 500 also includes random access memory (RAM) 504, and can include removable memory 514, such as flash memory, which also communicate with the CPU 502 over the bus 520. The imaging system 100 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A method of operating a buffering circuit comprising:
   passing a circuit signal through an upper stage having at least one buffer;
   passing said circuit signal from said upper stage through a plurality of sets of serially connected line buffers in a lower stage, each line buffer of said sets of serially connected line buffers in said lower stage connected to a respective parallel input of a device, wherein each set is connected to a buffer of said upper stage; and
   inputting said circuit signal into the respective device inputs, wherein each of said respective device inputs receives said circuit signal at different times.

2. The method of claim 1, wherein said circuit signal is input to the device inputs by driving the sets of line buffers of said lower stage.

3. The method of claim 1, wherein said buffer circuit is implemented on an imager.

4. The method of claim 1, wherein said buffer circuit is implemented on an imager and said circuit signal being input into said device inputs, wherein said device includes a plurality memory cells for storing the digital signals converted by a plurality of analog-to-digital converters.

5. The method of claim 1, wherein an said buffer circuit is implemented on an imager having an imager array connected to at least one analog-to-digital converter connected to a ramp generator, and a RAM memory, wherein said circuit signal is a ramp signal that is applied to the parallel inputs of the RAM through said buffer circuit.

6. The method of claim 1, wherein said common signal is a clock signal.

7. The method of claim 6, wherein said circuit signal reaches the device inputs within one clock cycle.

8. A buffer structure comprising:
   a plurality of sets of serially connected buffers in a lower stage, each buffer of said sets connected to a respective parallel input to a device; and
   an input to said buffer structure, where each set of serially connected buffers in said lower stage is connected to said input through a buffer of a higher order stage, wherein said buffer structure causes a signal applied to said input to reach said parallel inputs at different times.

9. The buffer structure of claim 8, wherein said sets of line buffers in the lower stage drive said signal applied to said input to the respective device inputs.

10. The buffer structure of claim 8, wherein a required number of buffer stages of the buffer structure is calculated using the equation Number of Stages=ceil(log x(N)), where x is the average number of buffer branches, N is the number of device inputs and ceil indicates the result should be rounded up.

11. The buffering structure of claim 8, wherein said signal passes through a different number of line buffers to reach each circuit input.

12. The buffering structure of claim 8, wherein said buffer circuit is implemented on an imager.

13. The buffer structure of claim 8, wherein said signal is a control signal.

14. A method of designing a buffer circuit comprising the acts of:
   calculating an average number of buffer branches based on predetermined design criteria;
   calculating a required number of buffer stages for a hierarchy of buffer stages based on said average number of branches;
   determining the number of stages to implement in said buffer circuit;
   determining the number of buffers for each stage of said hierarchy based on said average number of buffer branches; and
   positioning a plurality of sets of serially connected buffers in a lower stage of said hierarchy, each buffer of said sets connected to a respective parallel input to a device, wherein each set is connected to a buffer of a higher order stage of the hierarchy, using said determined number of stages and the determined number of buffers for each stage.

15. The method of claim 14, wherein said device inputs are driven by said respective set of serially connect line buffers of the lower stage.

16. The method of claim 14, wherein said average number of buffer branches is calculated using the equation 10^((log N)/S), where N is the number of circuit inputs and S is the maximum number of possible buffer stages.

17. The method of claim 14, wherein said required number of buffer stages is calculated using the equation Required Number of Stages=ceil(log x(N)), where x is the average number of buffer branches, N is the number of circuit inputs and ceil indicates the result should be rounded up.

18. The method of claim 14, wherein said buffer circuit is implemented on an imager.

19. A method of designing a buffer circuit implemented on an imager, said method comprising the acts of:
   calculating an average number of buffer branches based on predetermined design criteria;
   calculating a required number of buffer stages for a hierarchy of buffer stages based on said average number of branches;
   determining the number of stages to implement in said buffer circuit;
   determining the number of buffers for each stage of said hierarchy based on said average number of buffer branches; and
   positioning a plurality of sets of serially connected buffers in a lower stage of said hierarchy, each buffer of said sets connected to a respective parallel input to a device, wherein each set is connected to a buffer of a higher order stage of the hierarchy, using said determined number of stages and the determined number of buffers for each stage.

20. The method of claim 19, wherein said average number of buffer branches is calculated using the equation 10^((log N)/S), where N is the number of circuit inputs and S is the maximum number of possible buffer stages.

21. The method of claim 19, wherein said required number of buffer stages is calculated using the equation Required Number of Stages=ceil(log x(N)), where x is the average number of buffer branches, N is the number of circuit inputs and ceil indicates the result should be rounded up.

* * * * *